United States Patent
Moriya et al.

(10) Patent No.: US 7,862,638 B2
(45) Date of Patent: Jan. 4, 2011

(54) GAS SUPPLY SYSTEM FOR SEMICONDUCTOR MANUFACTURING APPARATUS

(75) Inventors: Shuji Moriya, Yamanashi (JP); Ken Nakao, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 282 days.

(21) Appl. No.: 12/061,982

(22) Filed: Apr. 3, 2008

(65) Prior Publication Data
US 2008/0251018 A1    Oct. 16, 2008

(30) Foreign Application Priority Data
Apr. 10, 2007   (JP)   ............... 2007-102556

(51) Int. Cl.
B01D 46/00   (2006.01)
H01L 21/205  (2006.01)
(52) U.S. Cl. .................. 55/385.1; 55/DIG. 15; 62/617
(58) Field of Classification Search ............ 55/385.1, 55/428, DIG. 15; 62/600, 606, 617
See application file for complete search history.

(56) References Cited

U.S. PATENT DOCUMENTS

| | | | |
|---|---|---|---|
| 6,444,011 B2 * | 9/2002 | Li et al. .................. 95/45 |
| 6,488,745 B2 * | 12/2002 | Gu .................. 95/272 |
| 6,863,019 B2 * | 3/2005 | Shamouilian et al. ... 118/723 R |
| 7,108,737 B2 * | 9/2006 | Neumann et al. .............. 95/45 |
| 2004/0037768 A1 * | 2/2004 | Jackson .................. 423/500 |
| 2007/0031321 A1 * | 2/2007 | Alvarez et al. .............. 423/490 |

FOREIGN PATENT DOCUMENTS

| | | |
|---|---|---|
| JP | 5-68826 | 3/1993 |
| JP | 5-68865 | 3/1993 |

* cited by examiner

*Primary Examiner*—Frank M Lawrence
(74) *Attorney, Agent, or Firm*—Oblon, Spivak, McClelland, Maier & Neustadt, L.L.P.

(57) ABSTRACT

A gas supply system according to the present invention comprises a gas filter disposed in a gas supply flow passage through which a gas is supplied to a semiconductor manufacturing apparatus and a metal component remover disposed in the gas supply flow passage downstream relative to the gas filter, which removes a volatile metal component contained in the gas flowing through the gas supply flow passage by liquefying the volatile metal component. The structure adopted in the gas supply system prevents entry of the volatile metal component, which cannot be eliminated through the gas filter, into the semiconductor manufacturing apparatus as the corrosive gas is supplied thereto by the gas supply flow passage.

6 Claims, 7 Drawing Sheets

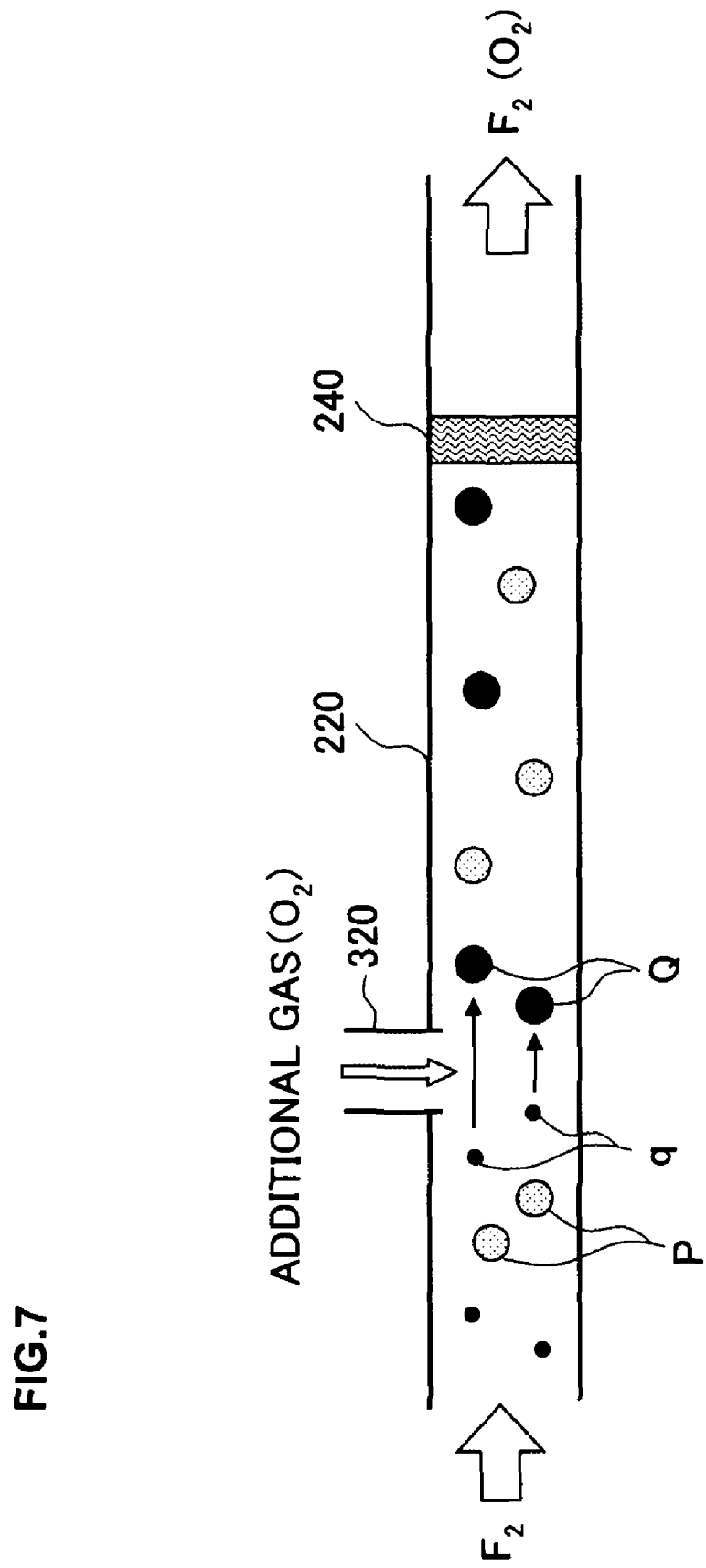

GAS SUPPLY SYSTEM FOR SEMICONDUCTOR MANUFACTURING APPARATUS

CROSS-REFERENCE TO RELATED APPLICATIONS

This document claims priority to Japanese Patent Application Number 2007-102556, filed on Apr. 10, 2007, the entire content of which are hereby incorporated by reference.

FIELD OF THE INVENTION

The present invention relates to a gas supply system that supplies a specific type of gas to a semiconductor manufacturing apparatus via a gas supply flow passage.

BACKGROUND OF THE INVENTION

A semiconductor manufacturing apparatus such as a diffusion apparatus, an etching apparatus or a sputtering apparatus includes a gas supply system that supplies a gas originating from a processing gas supply source, e.g., a gas canister, to the semiconductor manufacturing apparatus. At the semiconductor manufacturing apparatus, a processing target substrate such as a semiconductor wafer undergoes a surface treatment or the like as a semiconductor device manufacturing process, e.g., a film formation process or an etching process, is executed by using the specific type of gas supplied via the gas supply system.

Depending upon the type of processing executed during the semiconductor wafer manufacturing process, a highly corrosive gas such as chlorine gas or silane gas may be used and accordingly, various attempts are made toward clean gas supply by, for instance, constituting the gas supply flow passage with a gas piping material, e.g., SUS 316L, with better corrosion resistance than the materials typically used in the related art. For instance, there are gas flow passages partially or entirely constituted with a specific type of austenite stainless steel to assure good corrosion resistance over welded areas of the gas piping through which chlorine gas or silane gas is distributed (see, for instance, Japanese Laid Open Patent Publication No. H05-068865).

However, even when a gas piping constituted of stainless steel is used as a gas supply flow passage as described above, corrosion of the gas piping cannot be completely prevented, depending upon the type of corrosive gas supplied through it. In other words, the corrosive gas may react with the metal constituting the gas piping to form an undesirable metal compound or corrode the gas piping to result in contamination of the corrosive gas by the metal component (Fe, Cr or Ni) constituting the gas piping. A fluorine-containing corrosive gas (e.g., HF gas, $F_2$ gas or $ClF_3$ gas) in particular is extremely corrosive and even a gas piping constituted of stainless steel cannot be completely protected from corrosion caused by such a fluorine gas. Rather, the metal component contaminates the fluorine corrosive gas and also, the fluorine gas reacts with the metal constituting the gas piping and through the reaction, an undesirable metal compound (metal fluoride) is created.

The metal compound, the metal component and the like occurring in the gas supply flow passage as described above may be captured at a gas filter disposed in the gas supply flow passage so as to prevent their entry into the semiconductor manufacturing apparatus. Japanese Laid Open Patent Publication No. H05-068826 discloses a structure that includes a gas filter disposed in the gas supply passage of a heat treatment apparatus, so as to capture particles at the gas filter.

However, it has been learned that the metal compound or component present in the gas supply flow passage may not always be solid metallic particulates (e.g., particles) that can be captured at a gas filter and instead, and that they may assume a volatile metal component state (e.g., a vaporized state), in which case, they cannot be captured at the gas filter. This means that the metal compound and the metal component occurring in the gas supply flow passage cannot be thoroughly removed simply by disposing a gas filter in the gas supply flow passage.

A volatile metal component that passes through the gas filter subsequently enters the semiconductor manufacturing apparatus together with the corrosive gas. Once it enters the semiconductor manufacturing apparatus, it causes metal contamination, e.g., formation of particles over semiconductor wafers.

As ever higher integration is achieved in semiconductor devices to assure higher performance in recent years, even the metal contamination attributable to the volatile metal component can greatly affect the product yield, quality and reliability. Device defects attributable to metal contamination include defective patterns and degraded electrical characteristics.

SUMMARY OF THE INVENTION

An object of the present invention, having been completed by addressing the issues discussed above, is to provide a gas supply system for a semiconductor manufacturing apparatus with which contamination of a corrosive gas supplied to the semiconductor manufacturing device by a volatile metal component that cannot be removed through a gas filter can be prevented.

The object described above is achieved in an aspect of the present invention by providing a gas supply system for a semiconductor manufacturing apparatus, which supplies a specific gas to the semiconductor manufacturing apparatus via a gas supply flow passage, comprising a gas filter disposed in the gas supply flow passage and a metal component remover disposed in the gas supply flow passage further on a downstream side relative to the position at which the gas filter is installed, which removes a volatile metal component contained in the gas flowing through the gas supply flow passage by liquefying the volatile metal component.

According to the present invention described above, a metal component remover is disposed in the gas supply flow passage at a position further on the downstream side relative to the gas filter, so that a metallic contaminant that would contaminate a processing target substrate, generated as a highly corrosive gas, for instance, passes through the gas supply flow passage and traveling as solid metallic particulates, is captured at the gas filter for removal and that a metallic contaminant that would contaminate the processing target substrate, generated as the corrosive gas passes through the gas supply flow passage and traveling as a volatile metal component that cannot be trapped at the gas filter and thus passes through the gas filter, can be liquefied and removed in the metal component remover. As a result, the metallic contaminant in either state is prevented from entering the semiconductor manufacturing apparatus.

The metal component remover may include, for instance, a gas flow passage constituting part of the gas supply flow passage and a flow passage cooling means for cooling the gas flow passage from the outside by distributing a coolant on the outside of the gas flow passage. In this case, the metallic contaminant that flows into the gas flow passage in the metal component remover as the volatile metal component can be liquefied through cooling.

The flow passage cooling means in the metal component remover may distribute the coolant through a coiled coolant flow passage disposed so as to wind around the gas flow passage on the outside in the metal component remover. Through these measures, the gas flow passage can be cooled with a high level of efficiency and also, the highly corrosive gas flowing through the gas flow passage is not allowed to contact the coiled coolant flow passage itself.

In addition, the gas flow passage in the metal component remover may be disposed so as to range along a vertical direction, to allow the gas distributed through the gas supply flow passage to flow in through a lower side area of the gas flow passage and flow out through an upper side area, with a lower end of the gas flow passage formed as an open end to communicate with a liquid collection chamber. By cooling the vertical gas flow passage from the outside in the metal component remover as described above, the volatile metal component, which has become liquefied, is allowed to travel downward by the force of gravity and, as a result, the volatile metal component can be disposed of efficiently.

The gas flow passage in the metal component remover may be divided into, for instance, an inflow-side flow passage and an outflow-side flow passage, both ranging along the vertical direction with the gas flowing in from an upper side area of the inflow-side flow passage, a lower portion of the inflow-side flow passage made to communicate with a liquid collection chamber, a lower portion of the outflow-side flow passage made to communicate with the liquid collection chamber and the gas flowing out through an upper side area of the outflow-side flow passage. This structure, too, allows the volatile metal component having become liquefied to travel downward under the force of gravity to assure efficient removal of the volatile metal component.

The gas supplied through the gas supply flow passage may be, for instance, a fluorine-containing corrosive gas. Such a corrosive gas may be, for instance, HF gas, $F_2$ gas or $ClF_3$ gas, or a mixed gas containing the gases in combination.

The object described above is achieved in another aspect of the present invention by providing a gas supply system for a semiconductor manufacturing apparatus, which supplies a specific gas to the semiconductor manufacturing apparatus via a gas supply flow passage, comprising a gas filter disposed in the gas supply flow passage and an additional gas supply means disposed in the gas supply flow passage further toward an upstream side relative to a position at which the gas filter is installed, for supplying an additional gas to be used to chemically alter a volatile metal component contained in the gas distributed through the gas supply flow passage into a solid metal compound that can be trapped at the gas filter. The gas supplied through the gas supply flow passage may be, for instance, a fluorine-containing corrosive gas. The additional gas may be, for instance, $O_2$ gas.

According to the present invention described above, the additional gas is supplied at a position upstream of the gas filter at the gas supply flow passage. As a result, even if the metallic contaminant which would contaminate a processing target substrate, generated as a highly corrosive gas, for instance, is distributed through the gas supply flow passage and travels as a volatile metal component, the volatile metal component reacts with the additional gas and turns into a solid metal compound (e.g., a solid metal oxide). Such a solid metal compound can be trapped at the gas filter together with the metallic contaminant traveling as solid metallic particulates and can thus be removed through the gas filter. Consequently, their entry into the semiconductor manufacturing apparatus is prevented.

According to the present invention, the metallic contaminant which would contaminate the processing target substrate, generated as a highly corrosive gas is distributed through the gas supply flow passage, can be removed before it is allowed to flow into the semiconductor manufacturing apparatus, regardless of whether the metallic contaminant is traveling as solid metallic particulates or as a volatile metal component. In other words, entry of the metallic contaminant traveling through the gas supply flow passage into the semiconductor manufacturing apparatus can be prevented regardless of the state of the metallic contaminant.

BRIEF DESCRIPTION OF THE DRAWINGS

FIG. 7 illustrates the advantages achieved in the embodiment.

DETAILED DESCRIPTION OF THE PREFERRED EMBODIMENTS

Figure 1:
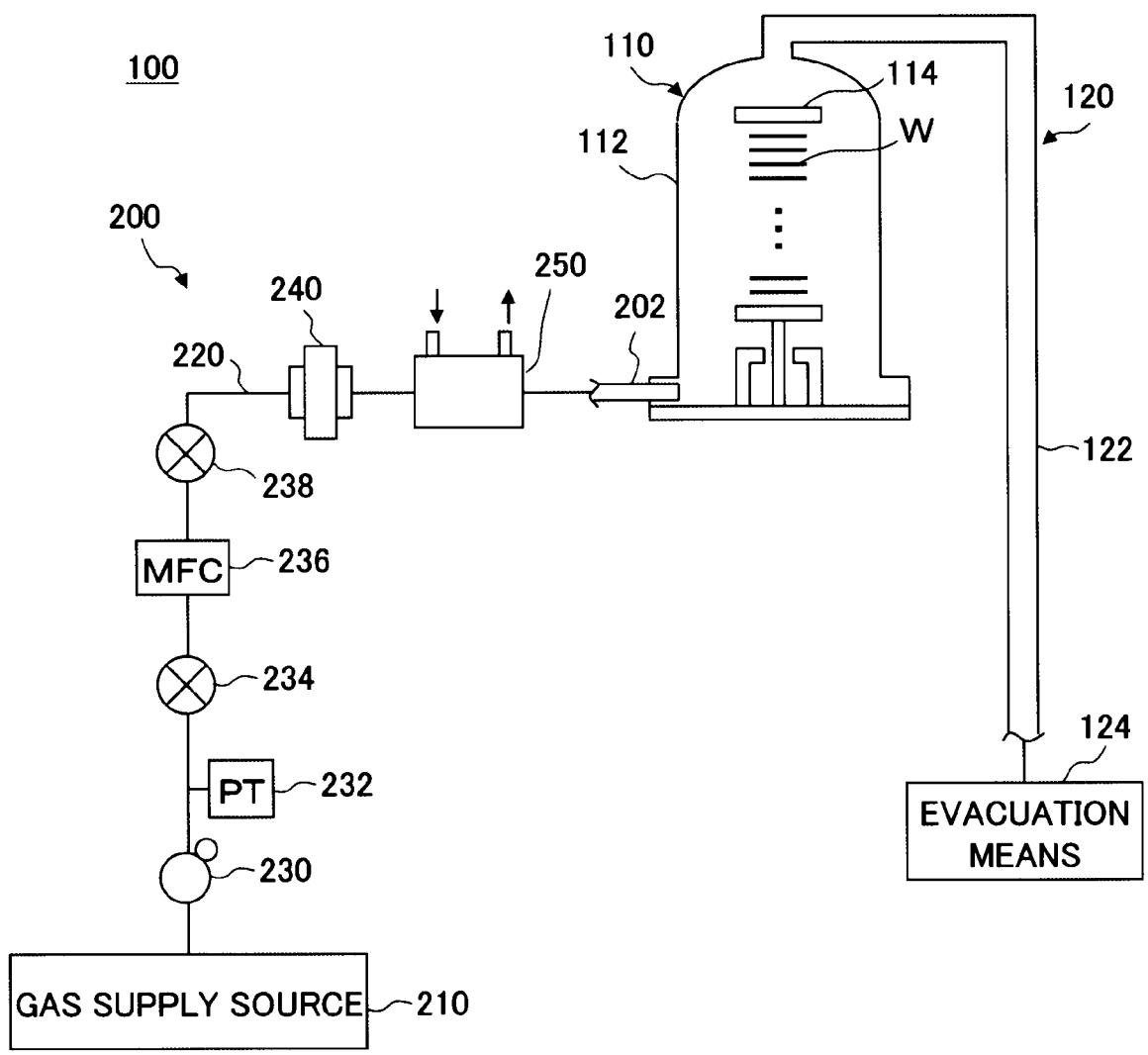
FIG. 1 presents a structural example for the heat treatment apparatus achieved in a first embodiment of the present invention.

In reference to the attached drawings, preferred embodiments of the present invention are explained in detail below. It is to be noted that in the description and the drawings, the same reference numerals are assigned to components assuming substantially identical functional structures to preclude the need for a repeated explanation thereof.

(Structural Example for the Semiconductor Manufacturing Apparatus Achieved in the First Embodiment)

First, the semiconductor manufacturing apparatus achieved in the first embodiment of the present invention is described in reference to a drawing. The semiconductor manufacturing apparatus described in reference to the first embodiment is a heat treatment apparatus that executes a specific heat treatment on a substrate such as a semiconductor wafer (hereafter may be simply referred to as a "wafer"). FIG. 1 presents a structural example for the heat treatment apparatus achieved in the first embodiment. The heat treatment apparatus 100 includes a heat treatment unit 110 functioning as a processing unit that processes (e.g., executes heat treatment on) a wafer W. As shown in FIG. 1, the heat treatment unit 110 is constituted of a vertically elongated reaction tube 112 functioning as a reaction container (processing container) or a reaction chamber (processing chamber). A holder 114 holding a plurality of wafers W can be carried into the reaction tube 112. The heat treatment unit 110 includes an exhaust system 120 that discharges the exhaust gas in the reaction tube 112, a gas supply system 200 through which a specific gas is supplied to the reaction tube 112 via a gas supply flow passage 220 and a heating means (e.g., a heater) (not shown) disposed outside the reaction tube 112.

Once the holder 114 holding a plurality of wafers W is carried into the reaction tube 112, the heat treatment unit 110 executes a specific heat treatment on the wafers W by heating the reaction tube 112 from the outside via the heating means while supplying the specific gas into the reaction tube 112 via the gas supply system 200 and discharging the exhaust gas in the reaction tube 112 through the exhaust system 120.

The exhaust system 120 includes an evacuation means 124 constituted with, for instance, a vacuum pump which is connected to the ceiling of the reaction tube 112 via an exhaust pipe 122. It is to be noted that although not shown in FIG. 1, the exhaust pipe 122 in the exhaust system 120 is connected through a bypass to the gas supply system 200 via a bypass line. The bypass line is formed by, for instance, connecting a bypass pipe to an upstream side position of the gas supply flow passage 220. An exhaust-side bypass cut-off valve is connected to the bypass pipe on the exhaust system side, whereas a supply-side bypass cut-off valve is connected to the bypass pipe further toward the gas supply system 200.

(Structural Example for the Gas Supply System Achieved in the First Embodiment)

Next, the gas supply system 200 representing an example of the gas supply system achieved in the first embodiment is explained. The gas supply system 200 includes a gas supply source 210 constituted with a pressurized canister filled with a fluorine-containing corrosive gas such as HF gas, $F_2$ gas or $ClF_3$ gas. This corrosive gas may be used as a processing gas when processing the wafers W or as a cleaning gas. One end of the gas supply flow passage 220 is connected to the gas supply source 210, whereas the other end of the gas supply flow passage 220 is connected to a nozzle (e.g., an injector) 202 through which the gas is delivered into the reaction tube 112. The gas from the gas supply source 210 is thus supplied into the reaction tube 112 via the gas supply flow passage 220.

A number of fluid control devices are disposed in the gas supply flow passage 220. The fluid control devices installed in the gas supply flow passage in the embodiment include; a pressure reducing valve (regulator) 230, a pressure meter (PT) 232, a first cut-off valve 234, a mass flow controller (MFC) 236, a second cut-off valve 238 and a gas filter (FE) 240, disposed in this order from the upstream side toward the downstream side in the gas supply flow passage 220 in FIG. 1.

The mass flow controller (MFC) 236 adjusts the flow rate of the gas supplied from the gas supply source 210 into the reaction tube 112. At the gas filter (FE) 240, particles such as solid metallic particulates contained in the gas distributed through the gas supply flow passage 220 are trapped.

In addition, a metal component remover 250 is disposed in the gas supply flow passage 220 at a position further toward the downstream side relative to the gas filter 240 in the first embodiment. The metal component remover 250 traps and collects a volatile metal component contained in the gas distributed through the gas supply flow passage 220 by liquefying the volatile metal component and a specific structure that may be adopted in the metal component remover is to be described in detail later.

The fluid control devices in the gas supply flow passage 220 are connected via, for instance, a gas piping or a flow passage block with a flow passage formed therein. The gas piping or the flow passage block should be constituted of, for instance, SUS 316L with relatively high corrosion resistance.

For instance, the interior of the reaction tube 112 may be cleaned by supplying the fluorine-containing gas, e.g., $F_2$ gas, originating from the gas supply source 210 into the reaction tube 112 through the gas supply system 200 achieved in the first embodiment structured as described above, with the flow rate of the fluorine-containing gas adjusted to a predetermined level at the mass flow controller (MFC) 236.

The $F_2$ gas flowing through the gas piping or through the flow passage inside the flow passage block in the gas supply flow passage 220 is highly corrosive and thus, the metal constituting the gas piping or the flow passage block will become corroded to form an undesirable metal compound (metal fluoride) or contaminate the $F_2$ gas with the metal component (Fe, Cr, Ni or the like) constituting the gas piping or the flow passage block.

Figure 2:
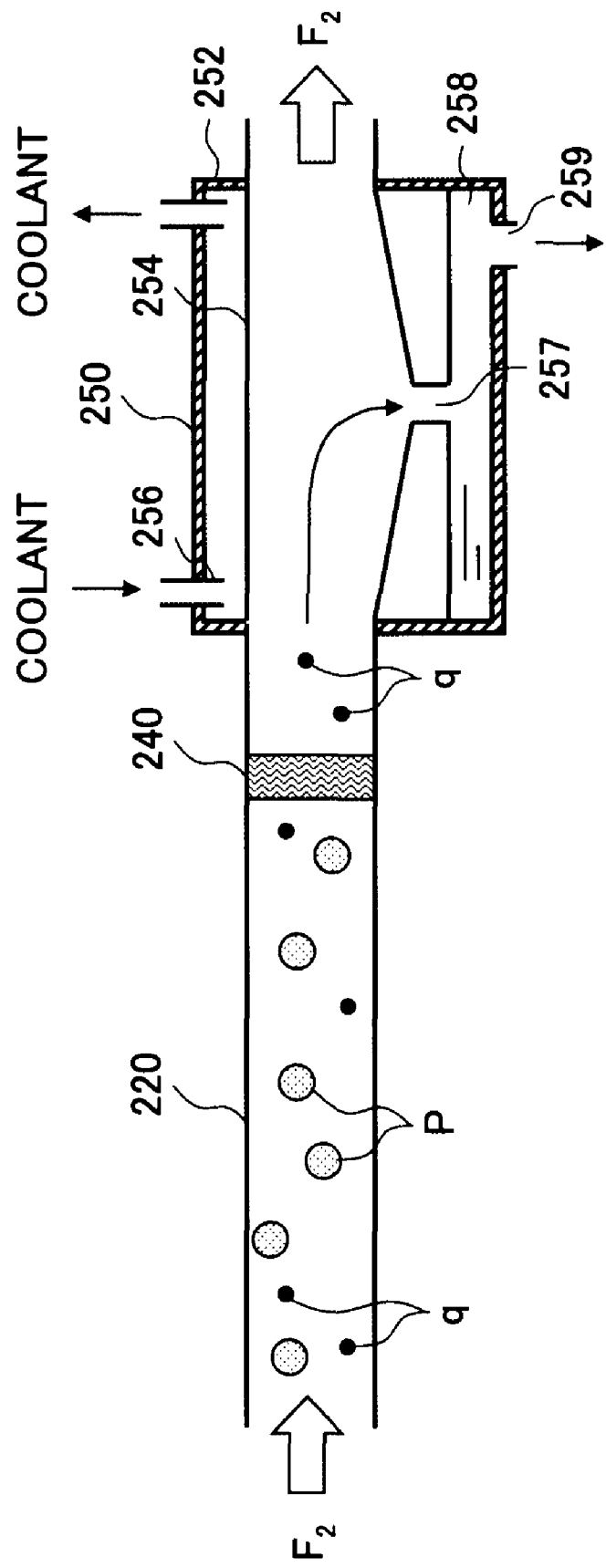
FIG. 2 schematically illustrates the structure and the functions of the metal component remover achieved in the embodiment.

The metal compound and the metal component in the gas supply flow passage 220 may be solid metallic particulates P (in a particle state) or a volatile metal component q (e.g., in a vaporized state) as shown in FIG. 2. Of these, the solid metallic particulates P are captured and trapped at the gas filter 240 and are thus not allowed to flow further toward the downstream side beyond the gas filter 240. However, the volatile metal component q, which cannot be captured at the gas filter 240, will flow toward the downstream side beyond the gas filter 240.

In other words, if the gas filter 240 alone was disposed in the gas supply flow passage 220, as in the related art, the volatile metal component q having passed through the gas filter 240 would enter the reaction tube 112 together with the $F_2$ gas to cause metal contamination, e.g., cause formation of particles over the wafers W.

Accordingly, the metal component remover 250 is disposed in addition to the gas filter 240, at a position further toward the downstream side relative to the gas filter in the embodiment. Thus, the volatile metal component q having passed through the gas filter 240 is removed at the metal component remover, thereby preventing entry of the volatile metal component q into the reaction tube 112.

As shown in FIG. 2, the metal component remover 250 includes a pipe frame member 252, a gas flow passage 254 disposed inside the frame member 252 and constituting part of the gas supply flow passage 220 and a flow passage cooling means 256 for cooling the gas flow passage 254 from outside by distributing coolant on the outside of the gas flow passage 254. The flow passage cooling means 256 distributes coolant originating from a medium supply source (not shown) with its temperature adjusted to a predetermined level around the periphery of the gas flow passage 254. The temperature of the coolant should be adjusted to a level at which the volatile metal component q present in the gas flow passage 254 is selectively liquefied.

Substantially halfway through the gas flow passage 254, a drain 257 through which the volatile metal component having been cooled by the flow passage cooling means 256 and having become liquefied is discharged from the gas flow passage 254, is formed. The drain 257 is made to communicate with a liquid collection chamber 258 in which the volatile metal component now in the liquid state is collected. A discharge port 259 through which the volatile metal component now in the liquid state, collected in the liquid collection chamber 258, is discharged, is formed at the liquid collection chamber. A discharge pipe, for instance, is connected to the discharge port 259 and thus, the volatile metal component now in the liquid state is discharged by ensuring that the liquefied metal component does not become vaporized again to flow back into the gas flow passage 254.

The volatile metal component q having passed through the gas filter 240 becomes cooled by the flow passage cooling means 256 and becomes liquefied inside the gas flow passage 254 at the metal component remover 250, as shown in FIG. 2.

The gas component constituting the $F_2$ gas in the gas flow passage 254, however, is allowed to travel through the gas flow passage 254 in the metal component remover 250 without becoming liquefied. The volatile metal component q having become liquefied in the gas flow passage 254 is collected in the liquid collection chamber 258 via the drain 257 and is then discharged to the outside of the gas flow passage 254 through the discharge port 259.

Since the volatile metal component q, which has not been removed through the gas filter 240 and has passed through the gas filter 240, is liquefied and removed via the metal component remover 250, entry of the volatile metal component q into the reaction tube 112 is prevented effectively.

Figure 3:
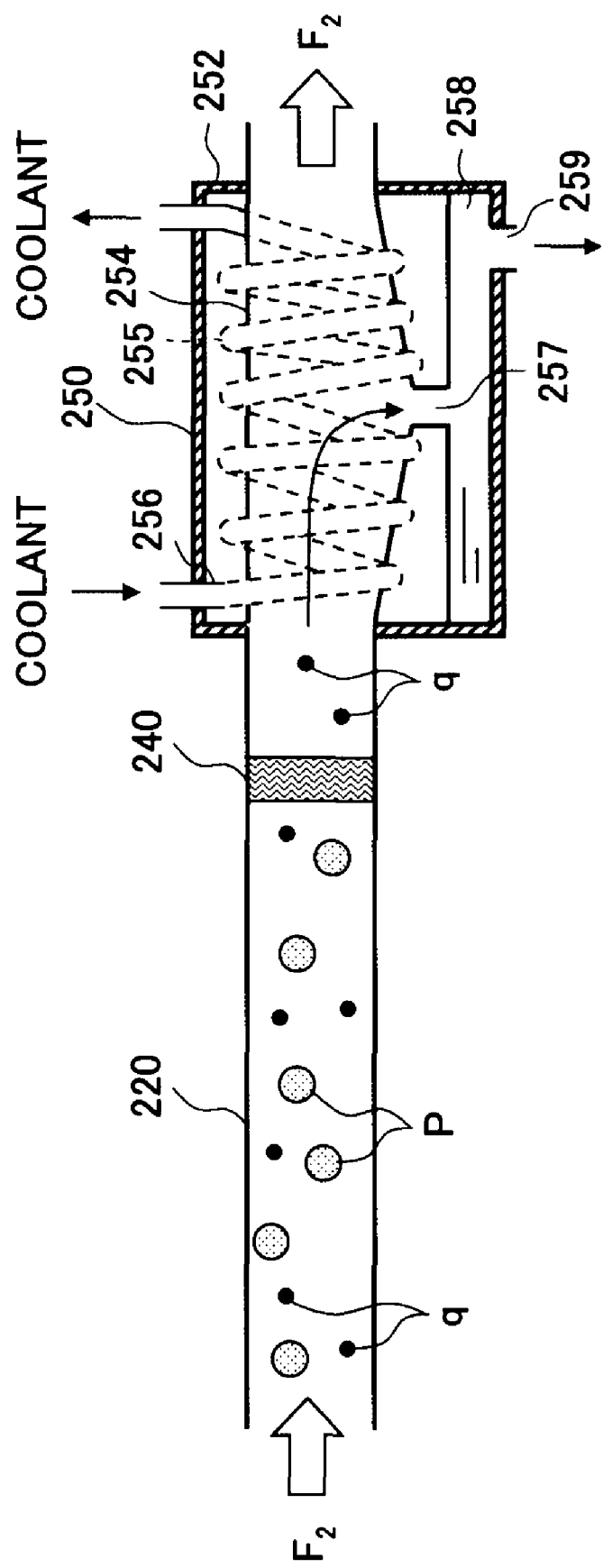
FIG. 3 illustrates an example of a variation of the metal component remover in FIG. 2.

It is to be noted that the flow passage cooling means 256 in the metal component remover 250 may adopt a structure other than that shown in FIG. 2 and that it may instead adopt a structure such as not shown in FIG. 3 with the coolant made to flow through a coiled coolant flow passage 255 wound around the gas flow passage 254 on its outside. As the coolant is distributed through such a coiled coolant flow passage 255, the gas flow passage 254 is cooled efficiently. It is to be noted that the winding part of the coiled coolant flow passage 255 is indicated by the dotted line in FIG. 3 so as to better show the effect achieved inside the gas flow passage 254 (the winding part is also indicated by a dotted lines in FIGS. 4 and 5).

In addition, since the coiled coolant flow passage 255, through which the coolant is distributed, is disposed on the outside of the gas flow passage 254, as described above, the highly corrosive gas flowing through the gas flow passage 254 is not allowed to contact the coiled coolant flow passage 255. Thus, the corrosive gas does not corrode the coiled coolant flow passage 255. As a result, the occurrence of another contamination is effectively prevented in the metal component remover 250.

Figure 4:
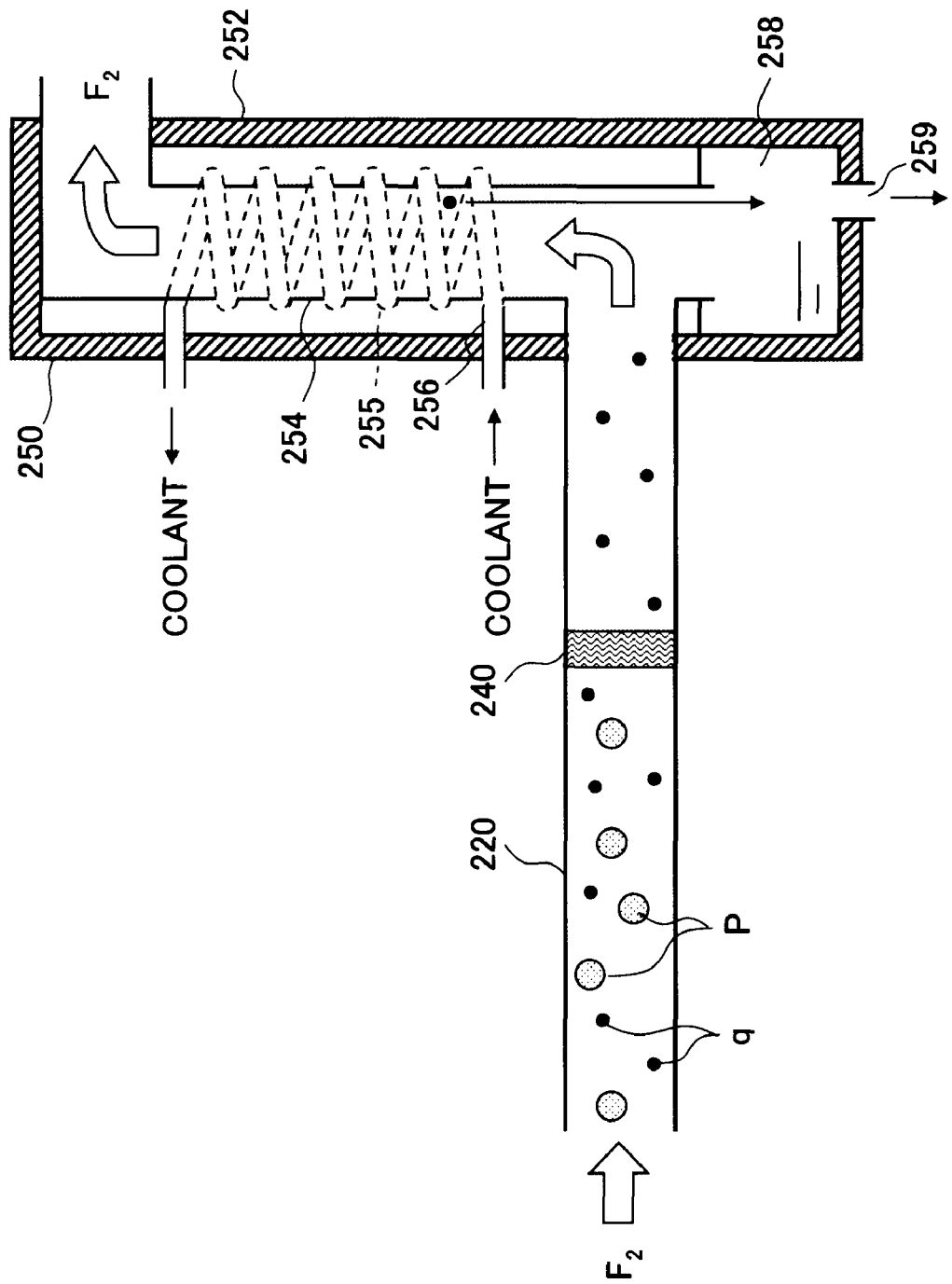
FIG. 4 schematically shows the structure assumed and the advantages achieved when the gas piping is disposed to range vertically in the metal component remover in the embodiment.

Another structural example for the metal component remover 250 is now explained in reference to a drawing. FIG. 4 presents an alternative structural example for the metal component remover 250. While the gas flow passage 254 is disposed in the metal component remover 250 so as to range along the horizontal direction in the structural examples shown in FIGS. 2 and 3, FIG. 4 shows a gas flow passage 254 disposed so as to range vertically within the metal component remover 250.

More specifically, in the metal component remover 250 shown in FIG. 4, the gas flow passage 254 is disposed so as to range vertically inside the frame member 252 with the open end at its bottom communicating with the liquid collection chamber 258 and the upper end of the gas flow passage 254 bent along the horizontal direction to open at a side of the metal component remover 250. The coiled coolant flow passage 255 through which the coolant flows is disposed so as to wind around the gas flow passage 254 along the vertical direction.

The gas passing through the gas filter 240 and distributed through the gas supply flow passage 220 enters the metal component remover 250 from a side area toward the bottom of the gas flow passage 254, travels upward along the vertical direction through the gas flow passage 254, flows out through the side area of the metal component remover 250 along the horizontally bent portion at the upper end of the gas flow passage 254 and then flows toward the reaction tube 112. At this time, the volatile metal component q contained in the gas flowing through the gas flow passage 254 becomes cooled and liquefied by the coolant distributed through the coiled coolant flow passage 255, the liquefied metal component then travels downward to be collected into the liquid collection chamber 258 located under the gas flow passage 254 by the force of gravity and the collected metal component is then discharged to the outside of the gas flow passage 254 via the discharge port 259.

By disposing the gas flow passage 254 so as to range vertically inside the metal component remover 250 and cooling the gas flow passage from the outside via the coiled coolant flow passage 255 as described above, the once volatile metal component q having become liquefied is allowed to travel downward under the force of gravity, thereby assuring efficient disposal of the volatile metal component q.

Figure 5:
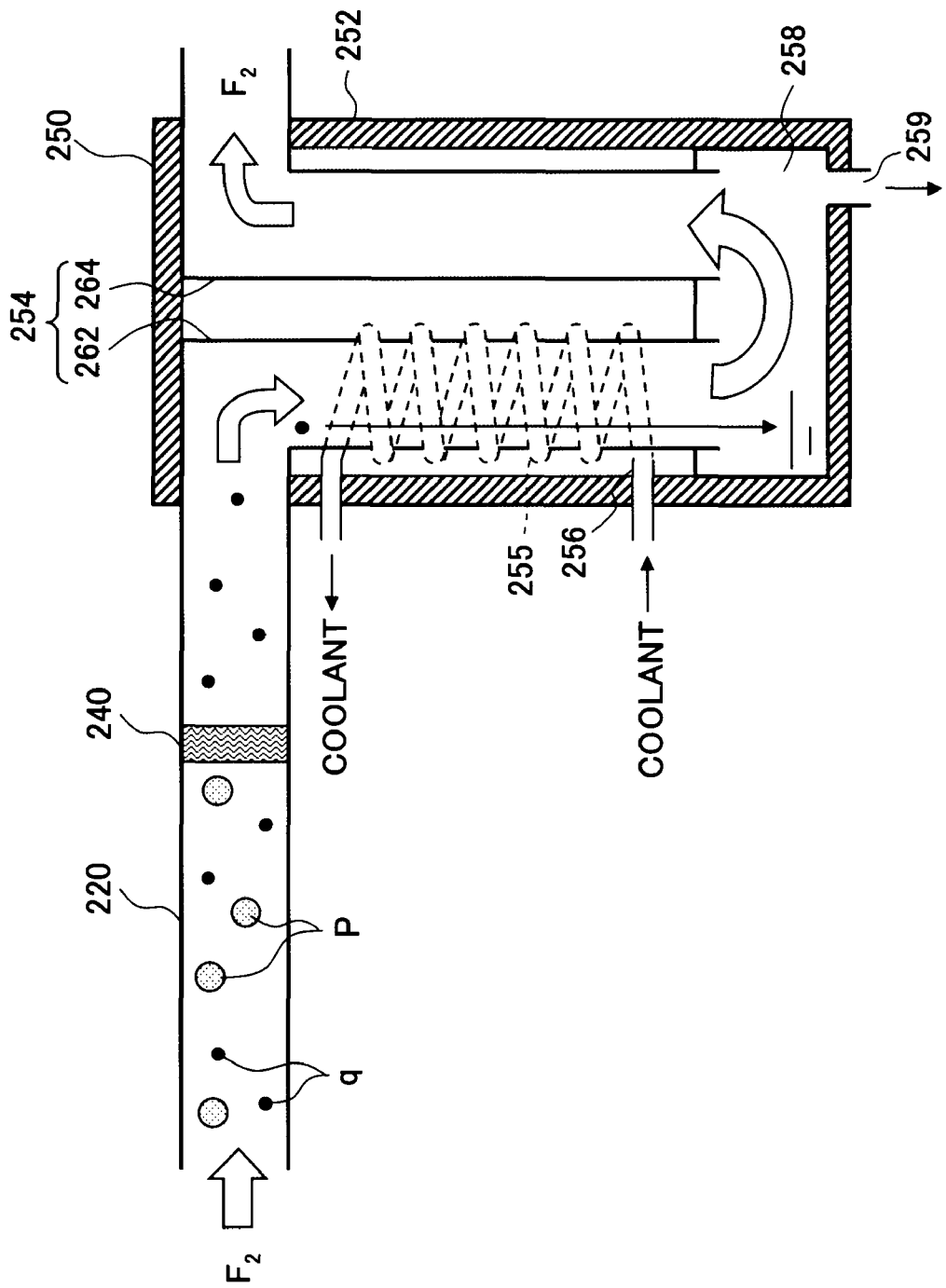
FIG. 5 illustrates an example of a variation of the metal component remover in FIG. 4.

It is to be noted that the metal component remover 250 equipped with the vertical gas flow passage 254 is not limited to the example presented in FIG. 4 and that the metal component remover may instead include a gas flow passage 254 such as that shown in FIG. 5, constituted with two separate flow passages, i.e., an inflow-side flow passage 262 and an outflow-side flow passage 264.

More specifically, the gas may flow in through a side area of the metal component remover 250 into the inflow-side flow passage 262 via its upper end bent along the horizontal direction, with the lower end of the inflow-side flow passage 262 made to communicate with the liquid collection chamber 258, as shown in FIG. 5. The outflow-side flow passage 264 is formed so that its lower end communicates with the liquid collection chamber 258 and that the gas flows out through a side area of the metal component remover 250 via the upper end of the outflow-side flow passage 264, which is bent along the horizontal direction. In this structure, the coiled coolant flow passage 255 may be disposed on the outside of the inflow-side flow passage 262, as shown in FIG. 5, or it may instead be disposed further outward relative to the outflow-side flow passage 264. Alternatively, coiled coolant flow passages 255 may be disposed further outward relative to both the inflow-side flow passage 262 and the outflow-side flow passage 264.

The gas having passed through the gas filter 240 and flowing through the gas supply flow passage 220 enters the metal component remover 250 shown in FIG. 5 via the horizontally bent portion at the upper end of the inflow-side flow passage 262, travels vertically downward along the inflow-side flow passage 262 and then flows into the lower end of the outflow-side flow passage 264 via the space at the liquid collection chamber 258. It then travels vertically upward along the outflow-side flow passage 264, flows out through a side area of the metal component remover 250 along the horizontally bent portion at the upper end of the outflow-side flow passage 264 and travels toward the reaction tube 112. At this time, the volatile metal component q contained in the gas flowing through the inflow-side flow passage 262 becomes cooled and liquefied by the coolant distributed through the coiled coolant flow passage 255, the liquefied metal component then travels downward to be collected into the liquid collection chamber 258 located under the inflow-side flow passage 262 under the force of gravity and the collected metal component is then discharged to the outside of the gas flow passage 254 via the discharge port 259.

In the metal component remover 250 shown in FIG. 5, too, the volatile metal component q having become liquefied is allowed to travel downward under the force of gravity, as in the metal component remover 250 shown in FIG. 4 and thus, efficient disposal of the volatile metal component q having become liquefied is achieved.

(Structural Example for the Gas Supply System Achieved in the Second Embodiment)

Figure 6:
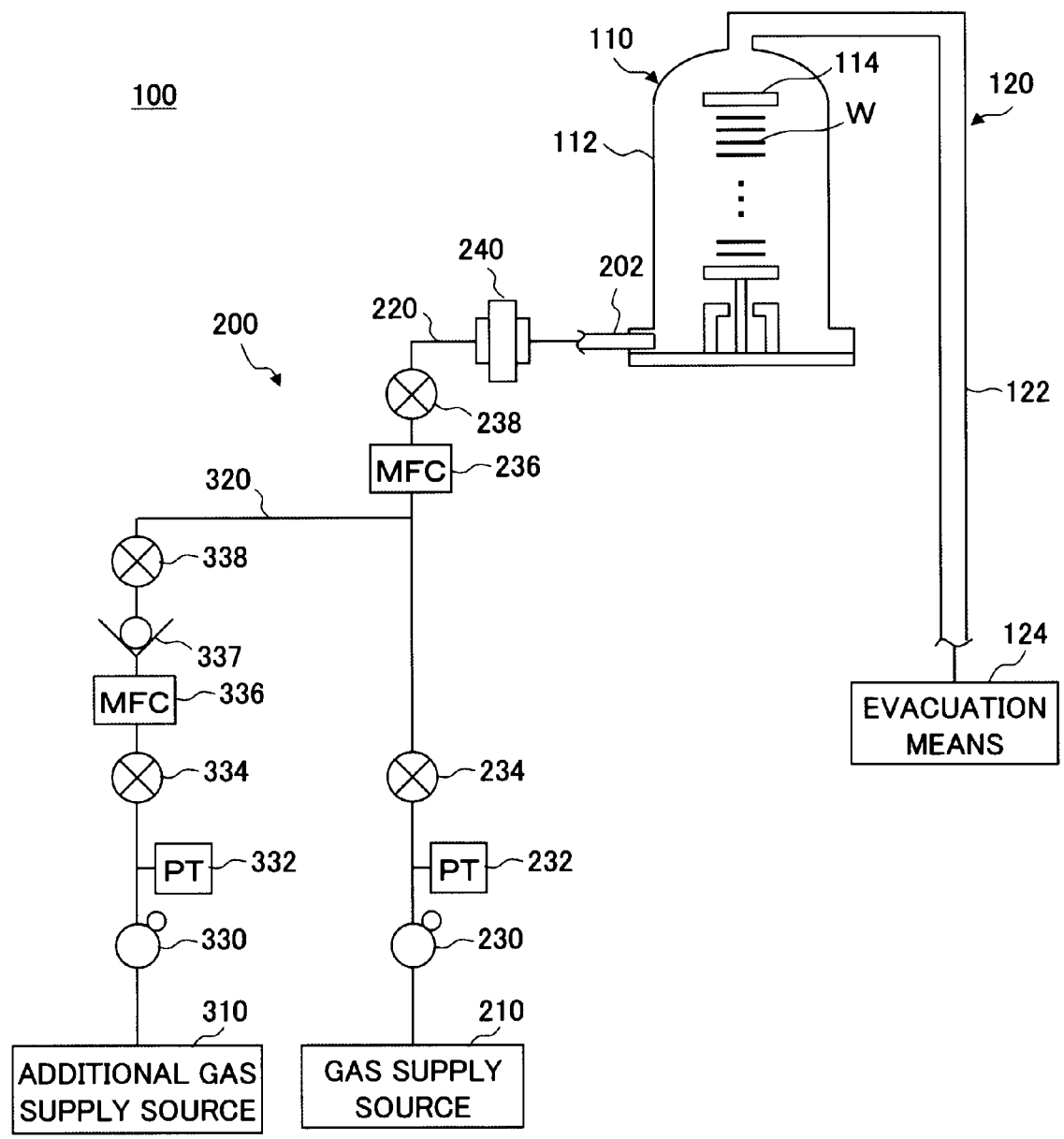
FIG. 6 presents a structural example for the gas supply system in the heat treatment apparatus achieved in a second embodiment of the present invention.

Next, a structural example that may be adopted in the gas supply system in the second embodiment is explained in reference to drawings. FIG. 6 shows a structural example that may be adopted in the heat treatment apparatus representing a semiconductor manufacturing apparatus that includes the gas supply system achieved in the second embodiment. In FIG. 6, the same reference numerals are assigned to components assuming substantially identical functions to those in FIG. 1, to preclude the necessity for a detailed explanation thereof.

While an explanation has been given in reference to the first embodiment on an example in which the metal component remover 250, through which the volatile metal component that could cause contamination is removed, is disposed further toward the downstream side relative to the gas filter 240 in the gas supply flow passage 220, the structure adopted in the second embodiment includes, instead of the metal component remover 250, an additional gas supply means disposed further toward the upstream side relative to the gas filter 240 in the gas supply flow passage 220, for supplying an additional gas that alters the volatile metal component q into a solid metal compound which can be trapped at the gas filter 240.

More specifically, as shown in FIG. 6, the additional gas supply means includes an additional gas supply source 310 constituted with a pressurized canister filled with the additional gas. The additional gas should be a type of gas that will chemically react with the volatile metal component (Fe, Cr, Ni or the like) present in the gas supply flow passage 220 in an oxidation reaction, a reduction reaction or the like so as to turn the volatile metal component into a solid metal compound. Such an additional gas may be oxygen ($O_2$) gas. $O_2$ gas oxidizes the volatile metal component and thus alters it into a solid metal oxide, i.e., a solid metal compound.

One end of an additional gas supply flow passage 320 is connected to the additional gas supply source 310, and the other end of the additional gas supply flow passage 320 is connected at a position upstream of the gas filter 240 in the gas supply flow passage 220, e.g., at a position between the first cut-off valve 234 and the mass flow controller (MFC) 236 in the gas supply flow passage 220.

A number of fluid control devices are disposed in the additional gas supply flow passage 320. The fluid control devices installed in the additional gas supply flow passage include; a pressure reducing valve (regulator) 330, a pressure meter (PT) 332, a first cut-off valve 334, a mass flow controller (MFC) 336, a check valve 337 and a second cut-off valve 338, disposed in this order from the upstream side toward the downstream side in the additional gas supply flow passage 320 in FIG. 6. Via the mass flow controller (MFC) 336, the flow rate of the additional gas supplied into the gas supply flow passage 220 via the additional gas supply flow passage 320 is adjusted.

For instance, the interior of the reaction tube 112 may be cleaned by supplying the fluorine-containing gas, e.g., $F_2$ gas, originating from the gas supply source 210 into the reaction tube 112 through the gas supply system 200 achieved in the second embodiment structured as described above, with the flow rate of the fluorine-containing gas adjusted to a predetermined level at the mass flow controller (MFC) 236. In addition, the additional gas such as $O_2$ gas originating from the additional gas supply source 310 is supplied into the gas supply flow passage 220 further toward the upstream side relative to the gas filter 240 (at a position between the first cut-off valve 234 and the mass flow controller (MFC) 236 in this example) with its flow rate adjusted to a specific level via the mass flow controller (MFC) 336.

As the highly corrosive $F_2$ gas flows through the gas supply flow passage 220, the $F_2$ gas corrodes the metal constituting the gas piping or the flow passage block that forms the gas supply flow passage 220. As a result, a metal compound and a metal component assuming a solid metallic particulate (P) state (e.g., a particle state) and also a volatile metal component (q) state, (e.g., a vaporized state) are both present inside the gas supply flow passage 220 as shown in FIG. 7.

Since the additional gas constituted with $O_2$ gas is supplied through the area further toward the upstream side relative to the gas filter 240 in the gas supply flow passage 220, the volatile metal component q becomes oxidized and turns into a solid metal oxide Q, as shown in FIG. 7. This solid metal oxide (solid metal compound) can be captured and trapped at the gas filter 240. In other words, the solid metal oxide can be eliminated at the gas filter 240.

As described above, since the volatile metal component q can be eliminated by altering it to a solid metal oxide Q that can be captured at the gas filter 240, entry of the volatile metal component q into the reaction tube 112 located further toward the downstream side relative to the gas filter 240 can be prevented.

It is to be noted that while most of the additional gas will be consumed in the chemical reaction with the volatile metal component, some of it may enter the reaction tube 112 together with the cleaning gas or the processing gas and, for this reason, the additional gas should be a type of gas, the presence of which in a small quantity in the reaction tube 112 will not adversely affect the processing executed in the reaction tube 112. In addition, the additional gas only needs to be supplied at a very small flow rate, just enough to alter the volatile metal component q into the solid metal oxide Q. Thus, the additional gas will enter the reaction tube 112 together with the cleaning gas or the processing gas only in a very small quantity and the cleaning processing or the substrate processing executed in the reaction tube 112 remains unaffected.

The gas supply system 200 achieved in the first or second embodiment described above may include a purge gas supply system (not shown) through which a purge gas such as $N_2$ gas to be used to purge the pipings and the reaction tube 112 is delivered.

While the invention has been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention.

For instance, while an explanation is given above in reference to the embodiments on an example in which the semiconductor manufacturing apparatus is constituted as a heat treatment apparatus, the present invention is not limited to this example and may be adopted in any of various types of semiconductor manufacturing apparatuses, as long as substrates or the like are processed therein by drawing in a gas. For instance, the semiconductor manufacturing apparatus may be an etching apparatus or a film formation apparatus instead of a heat treatment apparatus.

What is claimed is:

1. A gas supply system that supplies a corrosive gas to a semiconductor manufacturing apparatus via a gas supply flow passage, the gas supply system comprising:

a gas filter that removes at least solid-state metal particles contained in the gas flowing through said gas supply flow passage; and a metal component remover that removes a volatile metal component contained in a gas distributed through said gas supply flow passage by liquefying the volatile metal component, wherein said metal component remover is disposed downstream of said gas filter in said gas supply flow passage, said metal component remover includes a gas flow passage being part of said gas supply flow passage and a flow passage cooling means for cooling said gas flow passage from an outside by distributing a coolant on an outside of said gas flow passage, said gas flow passage in said metal component remover is divided into an inflow-side flow passage and an outflow-side flow passage, both passages disposed along a vertical direction, the gas flows in from an upper side area of said inflow-side flow passage, a lower portion of said inflow-side flow passage communicates with a liquid collection chamber, and a lower portion of said outflow-side flow passage communicates with said liquid collection chamber with the gas flowing out through an upper side area of said outflow-side flow passage.

2. A gas supply system according to claim 1, wherein:
the gas supplied through said gas supply flow passage is a fluorine-containing corrosive gas.

3. A gas supply system according to claim 1, wherein:
the gas supplied through said gas supply flow passage is HF gas, $F_2$ gas or $ClF_3$ gas, or a mixed gas containing the HF gas, $F_2$ gas and the $ClF_3$ gas in combination.

4. A gas supply system for a semiconductor manufacturing apparatus, which supplies a specific gas to said semiconductor manufacturing apparatus via a gas supply flow passage, the gas supply system comprising:

a gas filter disposed in said gas supply flow passage; and an additional gas supply means disposed in said gas supply flow passage further toward an upstream side relative to a position at which said gas filter is installed, the gas supply means for supplying an additional gas to be used to chemically alter a volatile metal component contained in gas distributed through said gas supply flow passage into a solid metal compound that is trapped at said gas filter.

5. A gas supply system according to claim 4, wherein:
the gas supplied through said gas supply flow passage is a fluorine-containing corrosive gas.

6. A gas supply system according to claim 4, wherein:
the additional gas is $O_2$ gas.

* * * * *